United States Patent
Tsai et al.

(10) Patent No.: US 9,148,113 B2
(45) Date of Patent: Sep. 29, 2015

(54) BALANCED-TO-UNBALANCED CONVERTER

(71) Applicant: Siliconware Precision Industries Co., Ltd., Taichung (TW)

(72) Inventors: Ming-Fan Tsai, Taichung (TW); Hsin-Hung Lee, Taichung Hsien (TW); Chia-Chu Lai, Taichung (TW); Yen-Yu Chen, Taichung (TW); Ho-Chuan Lin, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 301 days.

(21) Appl. No.: 13/644,507

(22) Filed: Oct. 4, 2012

(65) Prior Publication Data

US 2014/0015621 A1    Jan. 16, 2014

(30) Foreign Application Priority Data

Jul. 11, 2012   (TW) ............................... 101124879 A

(51) Int. Cl.
 *H03H 7/42* (2006.01)
(52) U.S. Cl.
 CPC ...................................... *H03H 7/42* (2013.01)
(58) Field of Classification Search
 CPC ....................................................... H03H 7/42
 USPC ............................................ 333/25, 26, 103
 See application file for complete search history.

(56) References Cited

U.S. PATENT DOCUMENTS

| | | | | |
|---|---|---|---|---|
| 7,116,185 | B2 * | 10/2006 | Ohi et al. | 333/25 |
| 7,205,861 | B2 * | 4/2007 | Inoue et al. | 333/25 |
| 7,330,085 | B2 * | 2/2008 | Ezzeddine | 333/26 |

* cited by examiner

*Primary Examiner* — Benny Lee
*Assistant Examiner* — Erfan Faneian
(74) *Attorney, Agent, or Firm* — Mintz Levin Cohn Ferris Glovsky and Popeo, P.C.; Peter F. Corless; Steven M. Jensen

(57) ABSTRACT

A balanced-to-unbalanced converter (balun) is provided, including: a converting circuit having a first processing circuit including a first inductor and a first capacitor connected in series, a second processing circuit including a second capacitor and a second inductor connected in series, the second capacitor being electrically connected to the first inductor, and two balanced output ends connected to the first processing circuit and the second processing circuit, respectively; and a preprocessing circuit connected to the converting circuit and including an unbalanced input end for converting real impedance at the unbalanced input end into complex impedance at the balanced output ends. Accordingly, the balun satisfies the need of the wireless communication chips by providing differential signals with complex impedance. This is done by employing the preprocessing circuit in conjunction with the converting circuit to convert an unbalanced signal with real impedance into a balanced signal with complex impedance.

6 Claims, 3 Drawing Sheets

BALANCED-TO-UNBALANCED CONVERTER

CROSS-REFERENCES TO RELATED APPLICATIONS

This application claims under 35 U.S.C. §119(a) the benefit of Taiwanese Application No. 101124879, filed Jul. 11, 2012, the entire contents of which is incorporated herein by reference.

FIELD OF THE INVENTION

The present invention relates to balanced-to-unbalanced converters (balun), and, more particularly, to a balun that converts real impedance into complex impedance.

BACKGROUND OF THE INVENTION

In recent years, with the advent of the personal wireless communication techniques, wireless communication devices are becoming more important in everyday life. In wireless communication applications, devices, such as double balanced mixers, push-pull amplifiers, balanced frequency multipliers, phase shifters, dipole antenna feeds, balanced modulators, 180-degree hybrids and the like, employ a balanced-to-unbalanced converter (or sometimes called "balun" for short), which converts an unbalanced signal to a pair of balanced differential signals with equal amplitude and antiphase, thereby reducing common-mode noise with the transmission of the differential signals.

However, a traditional balun is generally consisted of high-pass filters and low-pass filters. Therefore, there is a limitation that both the unbalanced input end and the balanced output end have to be in real impedance. However, more and more wireless communication chips require the use of differential signals with complex impedance as input signals. Thus, there is a need for a balun that is capable of converting an unbalanced signal with real impedance into a balanced signal with complex impedance.

SUMMARY OF THE INVENTION

In light of the foregoing drawbacks, an objective of the present invention is to provide a balanced-to-unbalanced converter, which includes: a converting circuit for performing impedance conversion, including a first processing circuit including a first inductor and a first capacitor connected in series, a second processing circuit including a second capacitor and a second inductor connected in series, the second capacitor being electrically connected to the first inductor, and two balanced output ends connected to the first processing circuit and the second processing circuit, respectively; and a preprocessing circuit connected to the converting circuit and including an unbalanced input end for converting real impedance at the unbalanced input end into complex impedance at the balanced output ends of the converting circuit.

In an embodiment, the first inductor of the first processing circuit has a first end that is not connected with the first capacitor and connected to a third end of the second capacitor of the second processing circuit that is not connected with the second inductor, and the first capacitor has a second end that is not connected with the first inductor and connected to the ground and a fourth end of the second inductor that is not connected with the second capacitor.

In an embodiment, the preprocessing circuit includes a third inductor and a third capacitor connected in series, one end of the third inductor not connected in series with the third capacitor is an unbalanced input end, one end of the third inductor connected in series with the third capacitor is an output end for connecting with the converting circuit, and one end of the third capacitor not connected in series with the third inductor is a grounded end.

The balanced-to-unbalanced converter of the present invention further provides a preprocessing circuit, which includes a third capacitor and a third inductor connected in series, one end of the third capacitor not connected in series with the third inductor is an unbalanced input end, one end of the third capacitor connected in series with the third inductor is an output end for connecting to the converting circuit, and one end of the third inductor not connected in series with the third capacitor is a grounded end.

The balanced-to-unbalanced converter of the present invention further provides a preprocessing circuit includes a third inductor and a third capacitor connected in series, one end of the third inductor not connected in series with the third capacitor is a grounded end, one end of the third inductor connected in series with the third capacitor is an unbalanced input end, and one end of the third capacitor not connected in series with the third inductor is an output end for connecting to the converting circuit.

The balanced-to-unbalanced converter of the present invention further provides a preprocessing circuit includes a third capacitor and a third inductor connected in series, one end of the third capacitor not connected in series with the third inductor is a grounded end, one end of the third capacitor connected in series with the third inductor is an unbalanced input end, and one end of the third inductor not connected in series with the third capacitor is an output end for connecting to the converting circuit.

From the above, it is clear that the balanced-to-unbalanced converter of the present invention satisfies the need of the wireless communication chips by providing differential signals with complex impedance, which is done by employing the preprocessing circuit in conjunction with the converting circuit to convert an unbalanced signal with real impedance into a balanced signal with complex impedance, thereby increasing the applications and performance of the balanced-to-unbalanced converter.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

Referring to FIGS. 1A to 1D, schematic diagrams illustrating exemplary structures of a balanced-to-unbalanced converter (Balun) according to the present invention are shown.

Figure 1A:
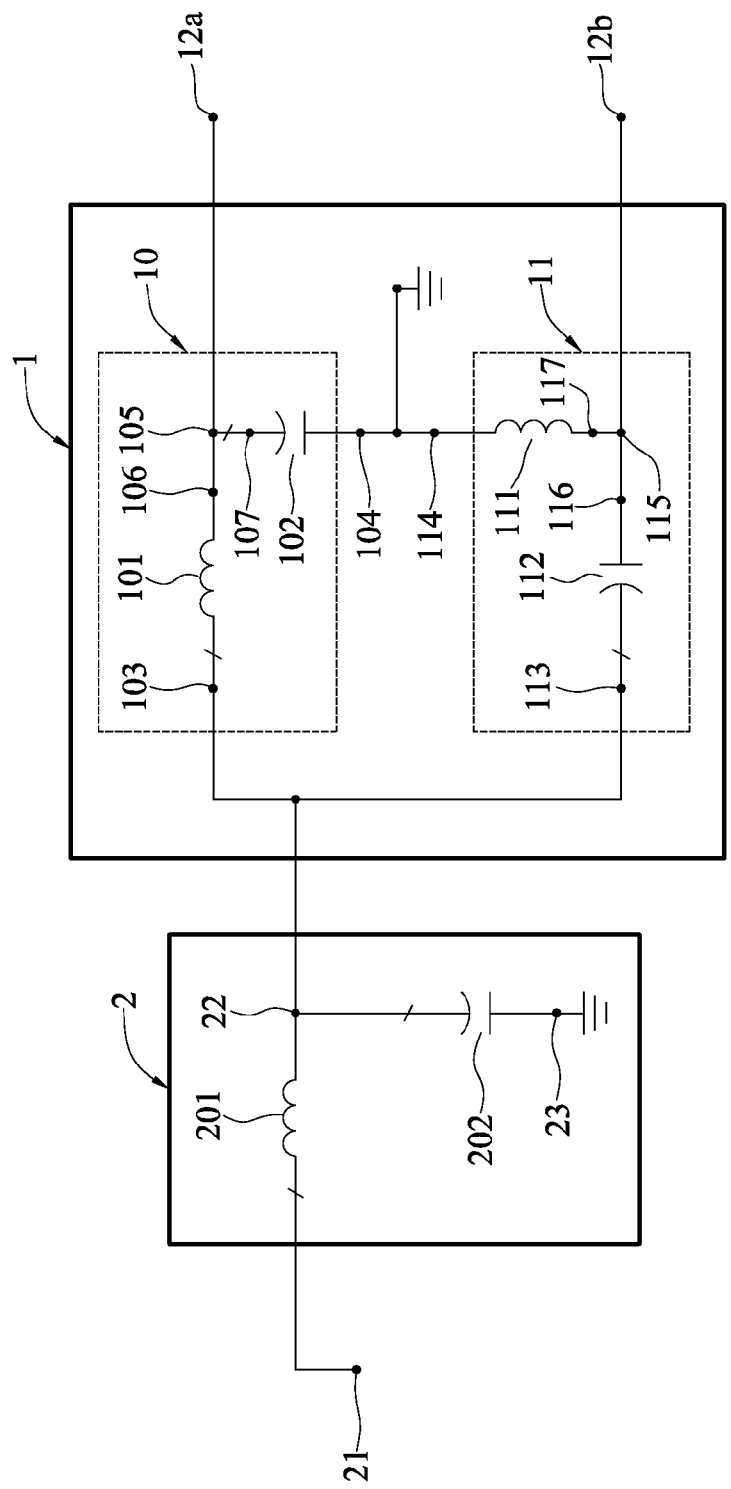
FIGS. 1A to 1D are schematic diagrams illustrating exemplary structures of a balanced-to-unbalanced converter (Balun) according to the present invention.

As shown in FIG. 1A, the Balun includes a converting circuit 1 and a preprocessing circuit 2. The converting circuit 1 is used for performing impedance conversion. The converting circuit 1 includes a first processing circuit 10 comprising a first inductor 101 and a first capacitor 102 connected in series; a second processing circuit 11 comprising a second capacitor 112 and a second inductor 111 connected in series, wherein the second capacitor 112 is electrically connected to the first inductor 101; and two balanced output ends 12a and 12b connected to the first processing circuit 10 and the second processing circuit 11, respectively. The preprocessing circuit 2 is connected to the converting circuit 1, and includes an unbalanced input end 21. The preprocessing circuit 2 is used to convert the real impedance at the unbalanced input end 21 into complex impedance at the balanced output ends 12a and 12b of the converting circuit 1.

The first inductor 101 has a first end 103 and a fifth end 106; the first capacitor 102 has a second end 104 and a sixth end 107; the second capacitor 112 has a third end 113 and a seventh end 116; the second inductor 111 has a fourth end 114 and a eighth end 117.

In an embodiment, one end of the first inductor 101 of the first processing circuit 10 not connected with the first capacitor 102 is called a first end 103, and one end of the first capacitor 102 not connected with the first inductor 101 is called a second end 104. Furthermore, one end of the second capacitor 112 of the second processing circuit 11 not connected with the second inductor 111 is called a third end 113, and one end of the second inductor 111 not connected with the second capacitor 112 is called a fourth end 114. The third end 113 is connected to the first end 103 of the first processing circuit 10 and the preprocessing circuit 2. The fourth end 114 is connected to the second end 104 of the first processing circuit 10 and the ground.

The balanced output end 12a is connected to a first output end 105 at a junction between the first inductor 101 and the first capacitor 102. The balanced output end 12b is connected to a second output end 115 at a junction between the second capacitor 112 and the second inductor 111.

In an embodiment, the preprocessing circuit 2 includes a third inductor 201 and a third capacitor 202 connected in series. One end of the third inductor 201 not connected in series with the third capacitor 202 is an unbalanced input end 21. One end of the third inductor 201 connected in series with the third capacitor 202 is an output end 22 for connecting to the converting circuit 1. One end of the third capacitor 202 not connected in series with the third inductor 201 is a grounded end 23.

In an embodiment, the first processing circuit 10 is a low-pass filter, and the second processing circuit 11 is a high-pass filter.

Figure 1D:
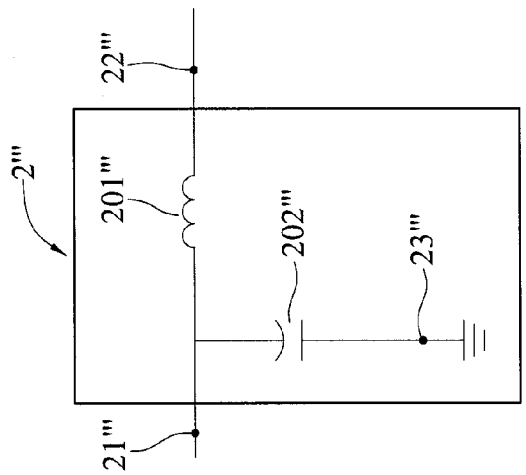
Figure 1C:
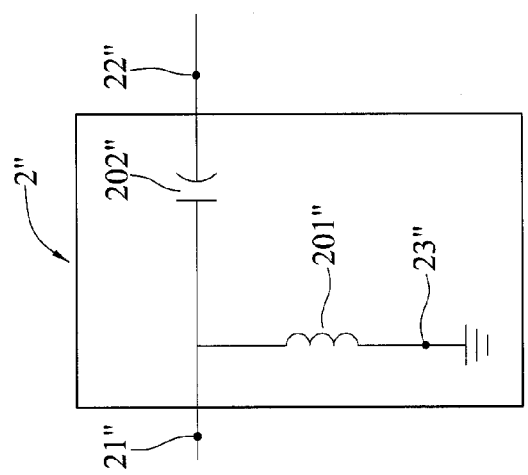
Figure 1B:
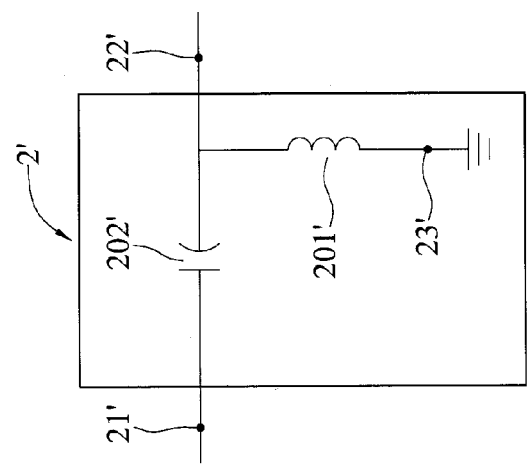

In another embodiment, as shown in FIG. 1B, a preprocessing circuit 2' includes a third capacitor 202' and a third inductor 201' connected in series. One end of the third capacitor 202' not connected in series with the third inductor 201' is an unbalanced input end 21'. One end of the third capacitor 202' connected in series with the third inductor 201' is an output end 22' for connecting to the converting circuit 1. One end of the third inductor 201' not connected in series with the third capacitor 202' is a grounded end 23'.

In yet another embodiment, as shown in FIG. 1C, a preprocessing circuit 2" includes a third inductor 201" and a third capacitor 202" connected in series. One end of the third inductor 201" not connected in series with the third capacitor 202" is a grounded end 23". One end of the third inductor 201" connected in series with the third capacitor 202" is an unbalanced input end 21". One end of the third capacitor 202" not connected in series with the third inductor 201" is an output end 22" for connecting to the converting circuit 1.

In a further embodiment, as shown in FIG. 1D, a preprocessing circuit 2''' includes a third capacitor 202''' and a third inductor 201''' connected in series. One end of the third capacitor 202''' not connected in series with the third inductor 201''' is a grounded end 23'''. One end of the third capacitor 202''' connected in series with the third inductor 201''' is an unbalanced input end 21'''. One end of the third inductor 201''' not connected in series with the third capacitor 202''' is an output end 22''' for connecting to the converting circuit 1.

In an embodiment, the balun of the present invention is designed in a multi-layer substrate. The multi-layer substrate can be a printed circuit board, ceramic substrate or an integrated circuit substrate.

Figure 2B:
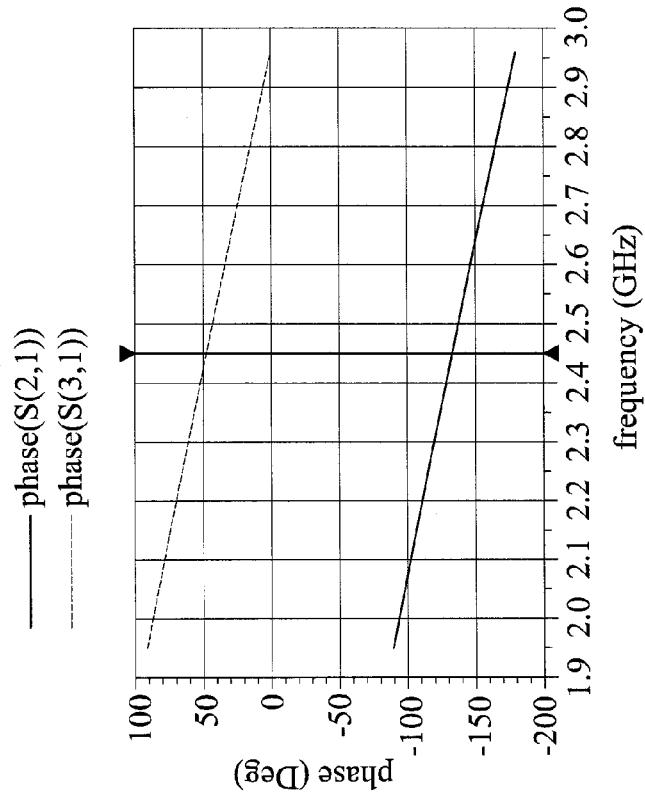
FIGS. 2A and 2B depict simulated results of the electrical characteristics and phase differences of the balun according to the present invention, respectively.
Figure 2A:
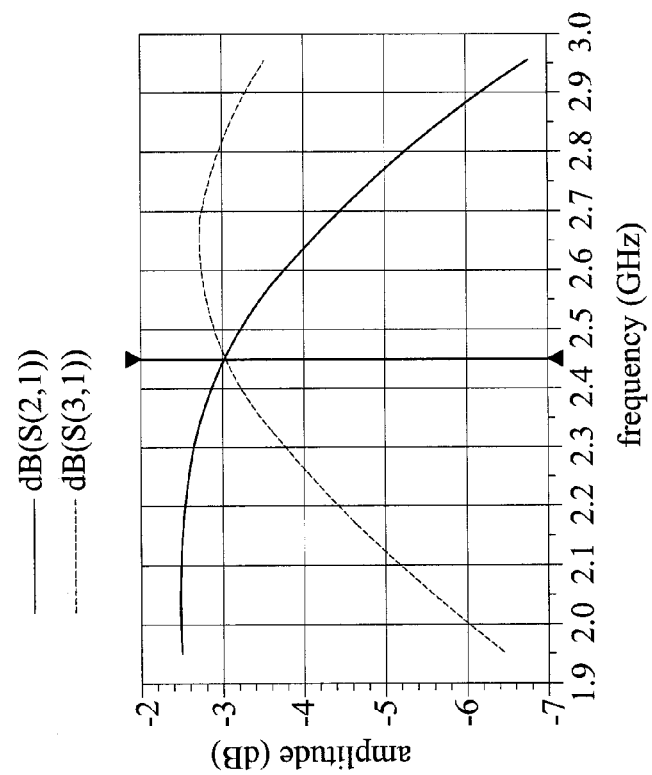

Referring to FIGS. 2A and 2B, graphs depicting simulated results of the electrical characteristics and phase differences of the balun of the present invention are shown, respectively. The horizontal axis in the graphs indicates frequency. With the use of the balun of the present invention, when the center frequency is 2.45 GHz, the loss of the two balanced output ends of the balun of the present invention are approximately 3 dB, and the phase difference is close to 180°. This satisfies the requirements of various radio-frequency devices.

In summary, the balun according to the present invention satisfies the need for using differential signals with complex impedance of the wireless communication chips by employing the preprocessing circuit in conjunction with the converting circuit to convert an unbalanced signal with real impedance into a balanced signal with complex impedance, increasing the applications and performance of the balun.

The above embodiments are only used to illustrate the principles of the present invention, and they should not be construed as to limit the present invention in any way. The above embodiments can be modified by those with ordinary skill in the art without departing from the scope of the present invention as defined in the following appended claims.

What is claimed is:

1. A balanced-to-unbalanced converter, comprising:
   a converting circuit for performing impedance conversion, comprising:
   a first processing circuit including a first inductor and a first capacitor connected in series;
   a second processing circuit including a second capacitor and a second inductor connected in series, wherein the second capacitor is electrically connected to the first inductor; and
   two balanced output ends connected to the first processing circuit and the second processing circuit, respectively; and
   a preprocessing circuit connected to the converting circuit and including an unbalanced input end for converting real impedance at the unbalanced input end into complex impedance at the balanced output ends of the converting circuit,
   wherein the preprocessing circuit includes a third capacitor and a third inductor connected in series, one end of the third capacitor not connected in series with the third inductor is a grounded end, one end of the third capacitor connected in series with the third inductor is an unbalanced input end, and one end of the third inductor not connected in series with the third capacitor is an output end for connecting to the converting circuit.

2. The balanced-to-unbalanced converter of claim 1, wherein the first inductor of the first processing circuit has a first end and a fifth end; the first end of the first inductor is connected to a third end of the second capacitor of the second processing circuit and the fifth end of the first inductor is connected in series with a sixth end of the first capacitor in the first processing circuit; the second capacitor of the second processing circuit has a seventh end, the seventh end of second capacitor of the second processing circuit is connected in series with an eighth end of the second inductor in the second processing circuit; the first capacitor of the first processing circuit has a second end, the second end of the first capacitor is connected to a ground and to a fourth end of the second inductor in second processing circuit.

3. The balanced-to-unbalanced converter of claim 1, wherein the balanced-to-unbalanced converter is designed in a multi-layer substrate.

4. The balanced-to-unbalanced converter of claim 3, wherein the multi-layer substrate is a printed circuit board, a ceramic substrate or an integrated circuit substrate.

5. The balanced-to-unbalanced converter of claim 1, wherein the first processing circuit is a low-pass filter.

6. The balanced-to-unbalanced converter of claim 1, wherein the second processing circuit is a high-pass filter.

* * * * *